(12) United States Patent
Jang

(10) Patent No.: US 11,864,328 B2
(45) Date of Patent: Jan. 2, 2024

(54) FPC CONNECTION STRUCTURE AND METHOD FOR CONNECTING TO PRINTED CIRCUIT BOARD BY USING SAME

(71) Applicant: LG Chem, Ltd., Seoul (KR)

(72) Inventor: Dong-Kwan Jang, Daejeon (KR)

(73) Assignee: LG Energy Solution, Ltd.

(*) Notice: Subject to any disclaimer, the term of this patent is extended or adjusted under 35 U.S.C. 154(b) by 577 days.

(21) Appl. No.: 17/044,400

(22) PCT Filed: Nov. 7, 2019

(86) PCT No.: PCT/KR2019/015093
§ 371 (c)(1),
(2) Date: Oct. 1, 2020

(87) PCT Pub. No.: WO2020/101269
PCT Pub. Date: May 22, 2020

(65) Prior Publication Data
US 2021/0105901 A1    Apr. 8, 2021

(30) Foreign Application Priority Data
Nov. 13, 2018 (KR) .................. 10-2018-0139353

(51) Int. Cl.
*H05K 3/32* (2006.01)
*H01R 43/02* (2006.01)
*H05K 1/14* (2006.01)
*H05K 3/36* (2006.01)

(52) U.S. Cl.
CPC ............ *H05K 3/328* (2013.01); *H01R 43/02* (2013.01); *H05K 1/145* (2013.01); *H05K 3/361* (2013.01)

(58) Field of Classification Search
CPC ........ H05K 3/328; H05K 3/361; H05K 1/145; H01R 43/02
USPC .......................................... 174/261
See application file for complete search history.

(56) References Cited

U.S. PATENT DOCUMENTS

| 2001/0021611 | A1 | 9/2001 | Onizuka et al. |
| 2004/0104967 | A1* | 6/2004 | Kim .................. B41J 2/14072 347/50 |
| 2008/0257587 | A1* | 10/2008 | Su ....................... H05K 3/4691 174/254 |
| 2010/0092845 | A1* | 4/2010 | Spare ................. H01M 50/247 429/90 |

(Continued)

FOREIGN PATENT DOCUMENTS

| CN | 103794746 A | 5/2014 |
| CN | 105307420 A | 2/2016 |

(Continued)

OTHER PUBLICATIONS

International Search Report for Application No. PCT/KR2019/015093 dated Feb. 25, 2020, 2 pages.

(Continued)

*Primary Examiner* — Andargie M Aychillhum
(74) *Attorney, Agent, or Firm* — Lerner David LLP

(57) ABSTRACT

An FPC connection structure including: several strands of FPC conductor patterns coated with an insulating film; and FPC terminals each extending from one end portion of each of the FPC conductor patterns and provided in a flat type to enable spot welding on a substrate terminal unit provided on the printed circuit board.

10 Claims, 3 Drawing Sheets

(56) References Cited

U.S. PATENT DOCUMENTS

| | | |
|---|---|---|
| 2014/0120401 A1 | 5/2014 | Shin et al. |
| 2017/0374742 A1 | 12/2017 | Hirasawa et al. |
| 2018/0151968 A1* | 5/2018 | Liskow .................. H01R 12/62 |

FOREIGN PATENT DOCUMENTS

| | | | |
|---|---|---|---|
| JP | H08162776 A | | 6/1996 |
| JP | H08186368 A | | 7/1996 |
| JP | H08213068 A | | 8/1996 |
| JP | H10334955 A | | 12/1998 |
| JP | 2002025653 A | | 1/2002 |
| JP | 2002171058 A | | 6/2002 |
| JP | 2002299000 A | * | 10/2002 |
| JP | 2002299000 A | | 10/2002 |
| JP | 200434715 A | | 2/2004 |
| JP | 2004146589 A | | 5/2004 |
| JP | 200841990 A | | 2/2008 |
| JP | 200891797 A | | 4/2008 |
| JP | 2008210619 A | * | 9/2008 |
| JP | 2008210619 A | | 9/2008 |
| JP | 4225094 B2 | | 2/2009 |
| JP | 2009253078 A | | 10/2009 |
| JP | 2014099537 A | | 5/2014 |
| JP | 2014127674 A | | 7/2014 |
| JP | 2015115459 A | | 6/2015 |
| JP | 2015233125 A | | 12/2015 |
| JP | 2017139394 A | | 8/2017 |
| JP | 2017228648 A | | 12/2017 |
| KR | 20150122409 A | | 11/2015 |
| KR | 20170043928 A | | 4/2017 |
| KR | 20180013460 A | | 2/2018 |

OTHER PUBLICATIONS

Extended European Search Report for EP19885844.1 dated Jun. 7, 2021; 8 pages.

* cited by examiner

FPC CONNECTION STRUCTURE AND METHOD FOR CONNECTING TO PRINTED CIRCUIT BOARD BY USING SAME

CROSS-REFERENCE TO RELATED APPLICATIONS

The present application is a national phase entry under 35 U.S.C. § 371 of International Application No. PCT/KR2019/015093 filed Nov. 7, 2019, published in Korean, which claims priority from Korean Patent Application No. 10-2018-0139353 filed Nov. 13, 2018, all of which are incorporated herein by reference.

TECHNICAL FIELD

The present disclosure relates to a structure and a connection method for connecting a flexible printed circuit (FPC) to a printed circuit board, and more particularly, to an FPC connection structure capable of bonding an FPC to a printed circuit board by using a spot welding method, and a connection method of the FPC and the printed circuit board using the FPC connection structure.

BACKGROUND ART

In addition to secondary batteries, a battery pack includes various battery pack protection devices such as a battery management system (BMS). Such protection devices may perform various functions of managing charge/discharge of the battery pack and securing safety, and the representative factor considered in performing the functions may be a voltage of each secondary battery. For example, a specific protection device may prevent overcharging or overdischarging of the secondary battery through voltage values at both ends of each secondary battery, and may perform a balancing function to reduce a charging state variation between the secondary batteries.

As described above, since sensing the voltage of each secondary battery included in the battery pack is very important and essential in performing a specific function of the protection device included in the battery pack, in the conventional battery pack, a voltage sensing structure for detecting the voltage of the secondary battery is mostly applied. Representative voltage sensing structures include a wire method and a connector connection method.

The wire method is a method of connecting a sensing wire to a printed circuit board (PCB) on which an electrode unit of a secondary battery and a BMS circuit chip are mounted by using a clip. Such a wire method is excellent in assembling, but the product cost increases due to the addition of a wire component. In addition, it is inconvenient to efficiently assemble a plurality of wires together with the secondary batteries inside a pack case in terms of space.

The connector connection method uses a flexible printed circuit (FPC) called a flexible circuit board and a connector and is a method of, for example, coupling a female connector to one end of the FPC and coupling a male connector onto the PCB to connect the female connector and the male connector. The connector connection method is simpler than the wire method and more excellent than the wire method in the assembling convenience, but it is disadvantageous that the product cost also greatly increases due to the addition of a connector component and the addition of a surface-mount technology (SMT) process.

Therefore, there is a need for a new voltage sensing method capable of solving all the disadvantages of the wire method which has low space layout efficiency and has difficulty in arranging wires, and the disadvantage of the connector connection method which has a burdensome cost increase due to the addition of a connector and a mounting process thereof.

SUMMARY

Technical Problem

The present disclosure is designed to solve the problems of the related art, and therefore the present disclosure is directed to providing an FPC connection structure capable of connecting an FPC directly to a circuit board without a connector and a circuit board connection method using the same, thereby reducing the cost compared to the existing one.

Technical Solution

In one aspect of the present disclosure, there is provided an flexible printed circuit (FPC) connection structure connected to a printed circuit board to transmit power or a signal including a plurality of strands of FPC conductor patterns coated with an insulating film; and a plurality of FPC terminals, each FPC terminal extending from an end portion of a corresponding one of the FPC conductor pattern strands, wherein each FPC terminal is a flat plate adapted to enable spot welding on a substrate terminal unit provided on the printed circuit board.

Each of the FPC terminals may include a first bonding portion which is compressed with one end portion of each of the corresponding FPC conductor pattern strand so as to be connected to the corresponding FPC conductor pattern strand, and a second bonding portion which is in surface contact on the substrate terminal unit and is spot welded to the substrate terminal unit.

The first bonding portion may include at least one connection pin in contact with the corresponding FPC conductor pattern and vertically passing through the insulation film.

The FPC connection structure may further include a pin cover tightly fitted to an end portion of the at least one connection pin, wherein the pin cover avoids exposure of the end portion to a lower portion of the insulating film.

The FPC connection structure may further include an assembly guide member configured to support the FPC terminals and coupled to the printed circuit board.

The assembly guide member may include a terminal fixing portion including slits through which the FPC terminals are configured to pass, and a substrate mounting portion coupled to the printed circuit board by a bolt or a hook.

The FPC conductor pattern and the FPC terminal may be integrally formed, and each FPC terminal may have a width greater than each FPC conductor pattern strand and may not be coated with the insulating film.

Each FPC terminal may include a cutting hole between portions of the FPC terminal to be spot welded to the substrate terminal unit.

The FPC terminals may include nickel (Ni), and the substrate terminal unit may include copper (Cu) plated with gold (Au).

In another aspect of the present disclosure, there is provided an flexible printed circuit (FPC) connection method of connecting an FPC to a printed circuit board including bonding a plurality of flat-plate FPC terminals extending from end portions of a plurality of FPC conductor patterns coated with an insulating film to a substrate terminal unit of the printed circuit board by applying a spot resistance welding method.

Advantageous Effects

According to the present disclosure, an FPC connection structure capable of connecting an FPC directly to a printed circuit board (PCB) without a connector and a method thereof may be provided.

In the FPC connection structure according to the present disclosure, an FPC terminal may be manufactured in a flat type and directly bonded to the printed circuit board by using a spot welding method. Therefore, applying the FPC connection structure and an FPC bonding method may be economical since a component such as a connector is unnecessary.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

An FPC connection structure described below is a wiring component used to electrically connect electrode leads of secondary battery cells and a BMS printed circuit board in a battery pack and serves to transmit voltage values of the secondary battery cells to a BMS. The FPC connection structure according to the present disclosure is not limited in its use as a component for sensing the voltage of the battery pack. For example, the FPC connection structure may be used to transmit a signal or power provided by one device or circuit board to another device or circuit board.

Figure 1:
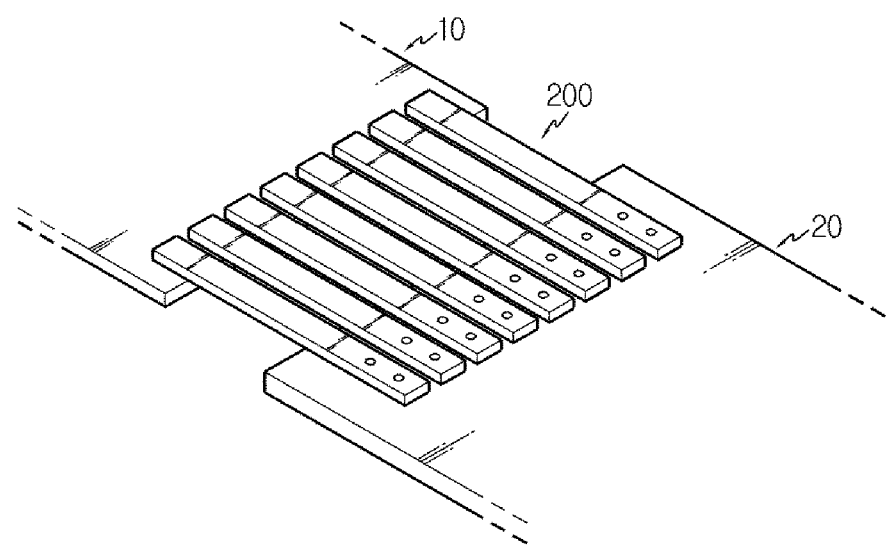
FIG. 1 is a perspective view illustrating a coupling of an FPC connection structure and a printed circuit board according to an embodiment of the present disclosure.
Figure 2:
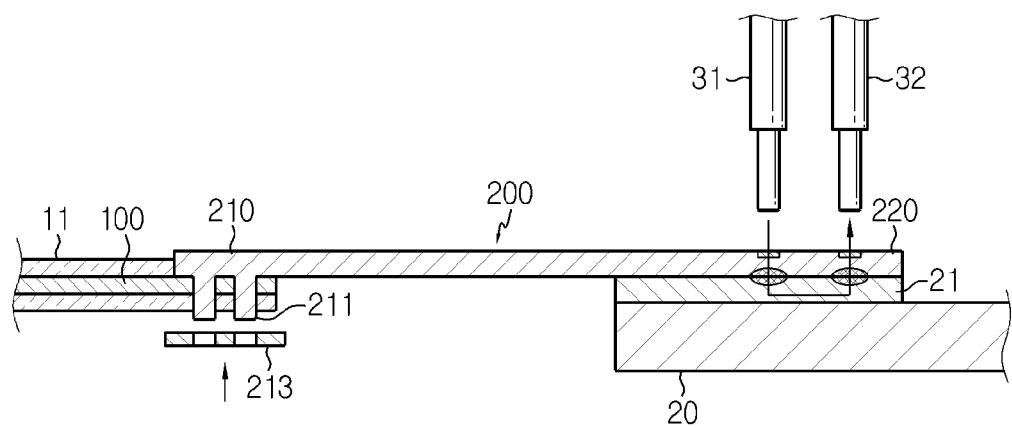
FIG. 2 is a diagram illustrating a spot welding process of the FPC connection structure and the printed circuit board of FIG. 1.

FIG. 1 is a perspective view illustrating a coupling of an FPC connection structure and a printed circuit board according to an embodiment of the present disclosure. FIG. 2 is a diagram illustrating a spot welding process of the FPC connection structure and the printed circuit board of FIG. 1.

Referring to these drawings, an FPC connection structure 10 according to an embodiment of the present disclosure may include several strands of FPC conductor patterns 100 coated with an insulating film 11 and FPC terminals 200 extending from one end of the FPC conductor patterns 100.

The FPC conductor patterns 100 may be embodied in the form of microcircuits that precisely corrode to a cover layer in the insulating film 11 by using, for example, the insulating film 11 formed of polyamide as a base and have both surfaces coated with the insulating film 11 and having flexibility and bending property.

Although the number of FPC conductor patterns 100 according to the present embodiment is eight, the number of FPC conductor patterns 100 may increase or decrease according to the number of signals to be transmitted.

One end of each of the FPC conductor patterns 100 is connected to the FPC terminals 200 provided to facilitate spot welding on the printed circuit board 20. Although not shown in the drawing, the other end of each of the FPC conductor patterns 100 may be electrically connected to the electrode leads of the battery cells.

For example, electrode leads of pouch type secondary batteries may be attached to metal bar type bus bars and connected in series or parallel. The other end of each of the FPC conductor patterns 100 may be attached to the bus bars by using welding.

The FPC conductor patterns 100 and the FPC terminal 200 may be connected to each other by using a compression method. For example, the FPC conductor patterns 100 and the FPC terminals 200 may face in a one-to-one manner and be pressed by applying heat and pressure such that the FPC conductor patterns 100 and the FPC terminals 200 may be coupled to each other.

In addition, in the present embodiment, the FPC conductor patterns 100 and the FPC terminals 200 may be respectively connected by using a pin coupling method in addition to the compression method in order to increase the coupling reliability of the FPC conductor patterns 100 and the FPC terminals 200.

Specifically, the FPC terminals 200 may include a first bonding portion 210 that is compressed to one end of the FPC conductor patterns 100, and a second bonding portion 220 that is in surface contact on a substrate terminal unit 21 and is spot welded.

The first bonding portion 210 includes at least one connection pin 211 that contacts the FPC conductor pattern 100 and vertically passes through the insulating film 11.

With the above configuration, when one end of the FPC conductor pattern 100 and the first bonding portion 210 of the FPC terminal 200 are compressed, two connection pins 211 may vertically pass through the FPC conductor pattern 100 and the insulating film 11

Therefore, the FPC conductor pattern 100 and the FPC terminal 200 may be compressed up and down to secure fixing property and the fixing property may be reinforced by the connecting pin 211, thereby stably connecting the FPC conductor pattern 100 and the FPC terminal 200.

In addition, the FPC connection structure 10 may further include a pin cover 213.

The pin cover 213 may vertically pass through the insulating film 11 and may be tightly fitted to the end portions of the connection pins 211 exposed to the lower portion of the insulating film 11.

The pin cover 213 may fix the vertical movement of the connection pins 211, and when compressing the first bonding portion 210 on the FPC conductor pattern 100, may be in surface contact with the lower surface of the insulating film 11, thereby preventing the lower surface of the insulating film 11 from being damaged.

The FPC terminals 200 according to the present disclosure may be provided in a flat type to enable spot welding on the substrate terminal unit 21 provided in the printed circuit board 20.

Here, the flat type may be referred to as a flat plate shape having a larger width than the FPC conductor patterns 100. In addition, the substrate terminal unit 21 may include metal patterns (not shown) which may be one-to-one correspondence to and in contact with the FPC terminals 200 on the printed circuit board 20.

Since the FPC conductor patterns 100 are thin and flexible, it is uneasy to directly perform spot welding on the FPC conductor patterns 100 in contact with the substrate terminal unit 21. However, since the FPC terminals 200 are provided in the form of a flat plate that is not relatively bent and has a large area compared to the FPC conductor patterns 100, it is easy to perform spot welding on the FPC terminals 200 in surface contact with the substrate terminal unit 21.

Therefore, in the FPC connection structure 10 of the present disclosure, the FPC terminals 200 are spot welded to the substrate terminal unit 21 and thus function as a medium for connecting the FPC conductor patterns 100 and the substrate terminal unit 21.

The FPC connection method for the printed circuit board 20 according to the present disclosure may include step of bonding the FPC terminal 200 to the substrate terminal unit 21 by applying a spot welding method using the FPC connection structure 10 as described above.

The spot welding method may employ a spot resistance welding method of semi-melting a joining unit of a base material by resistance heat generated by causing a large current to flow in the joining unit using a pair of welding rods 31 and 32 having different polarities and applying pressure to the joining unit.

In this regard, the FPC terminals 200 are not particularly limited as long as they are electrically conductive materials. However, considering the ease of processing, one material selected from the group consisting of nickel, brass, aluminum, copper, and their selective alloys and iron coated with nickel on the outer surface may be preferable. In addition, metal patterns constituting the substrate terminal unit 21 may be preferably formed of copper (Cu) plated with gold (Au).

Subsequently, the FPC connection structure 10 according to the second to fourth embodiments of the present disclosure will be described continuously with reference to FIGS. 3 to 7. The same reference numerals as the above-described embodiment denote the same elements, and the redundant descriptions for the same elements will be omitted and differences between the present embodiments and the above-described embodiment will be mainly described.

Figure 3:
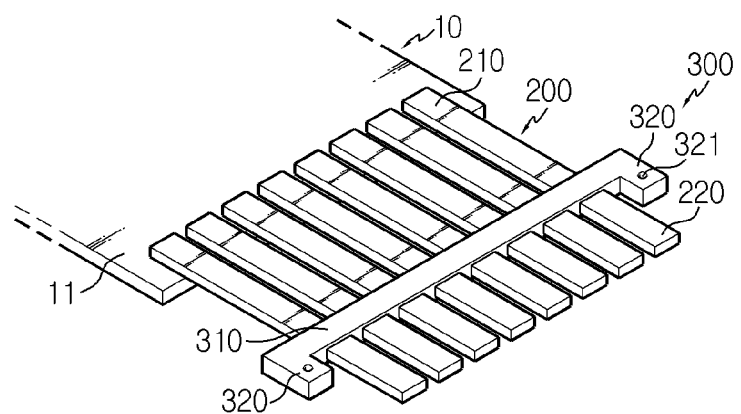
FIG. 3 is a perspective view of an FPC connection structure according to a second embodiment of the present disclosure.
Figure 4:
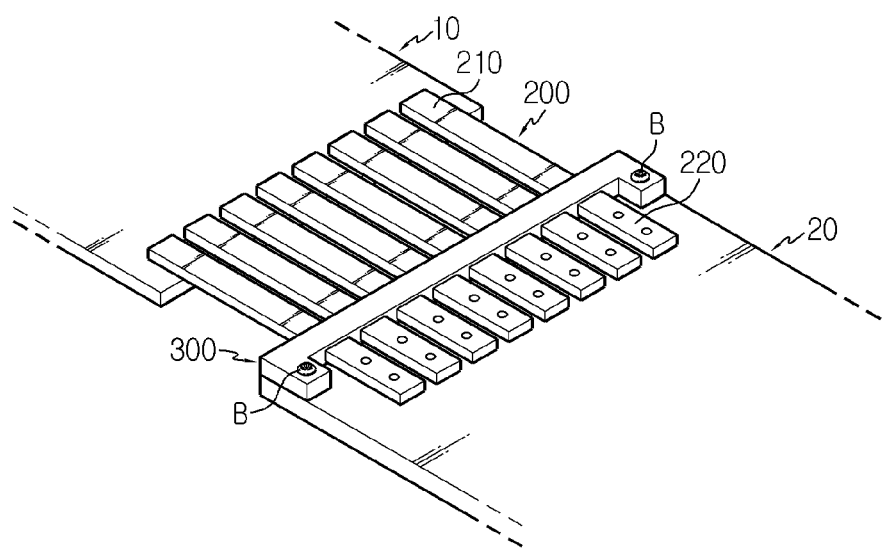
FIG. 4 is a perspective view illustrating a coupling of the FPC connection structure and the printed circuit board of FIG. 3.

First, the FPC connection structure 10 according to the second embodiment of the present disclosure further includes an assembly guide member 300, as shown in FIGS. 3 and 4.

The assembly guide member 300 may integrally support the FPC terminals 200 and may be fixedly coupled to one side of the printed circuit board 20 and thus function as a component that provides the assembly convenience.

Specifically, the assembly guide member 300 may include a terminal fixing portion 310 that is formed of an insulating material such as plastic and in which slits through which the FPC terminals 200 may respectively pass are formed and a substrate mounting portion 320 that is coupled to the printed circuit board 20 by using a bolt or hook fastening method.

The terminal fixing portion 310 may extend in a direction crossing the FPC terminals 200 and the slits may be formed in the same direction as the FPC terminals 200 in the body. The FPC terminals 200 may be fitted into the slits one by one and assembled, and thus the FPC terminals 200 may be supported not to flow, and intervals of the FPC terminals 200 may remain constant.

The substrate mounting portion 320 may extend in the same direction as the FPC terminals 200 at both ends of the terminal fixing portion 310, and a fastening hole 321 for fastening a bolt B may be provided. As shown in FIG. 4, the assembly guide member 300 may be fixed to the printed circuit board 20 by fastening the substrate mounting portion 320 to the printed circuit board 20 with the bolt B.

In the first embodiment, the FPC terminals 200 may be placed at the correct welding position on the substrate terminal unit 21 and fixed not to flow by using a separate fixing tool in a process of preparing spot welding, but there may be difficulties if there is no fixing tool.

In contrast, in the second embodiment, when the assembly guide member 300 is mounted on the printed circuit board 20, the FPC terminals 200 may be placed at the correct welding position on the substrate terminal unit 21, and spot welding may be performed in a stable state. In addition, since the assembly guide member 300 is fastened to the printed circuit board 20 with the bolt B together with spot welding of the FPC terminals 200, the possibility that the FPC connection structure 10 is separated from the printed circuit board 20 even under impact or flow is significantly reduced.

Figure 5:
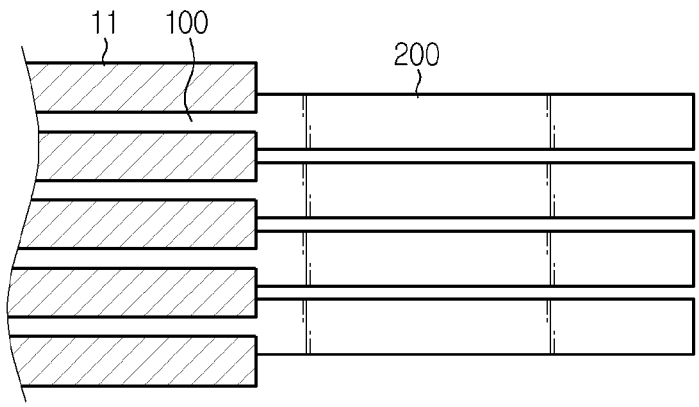
FIG. 5 is a diagram showing an FPC connection structure according to a third embodiment of the present disclosure.

Next, in the FPC connection structure 10 according to the third embodiment, as shown in FIG. 5, the FPC conductor pattern 100 and the FPC terminal 200 are integrally provided. That is, in the third embodiment, it is unnecessary for compressing and connecting the FPC conductor pattern 100 and the FPC terminal 200 to each other as in the embodiments described above.

In the case of the third embodiment, the FPC conductor pattern 100 is present in a state of being coated in the insulating film 11, the FPC terminal 200 may be formed in a flat type with a larger width than the FPC conductor pattern 100, may extend from one end portion of the FPC conductor patterns 100, and may be exposed to the outside of the insulating film 11.

Figure 6:
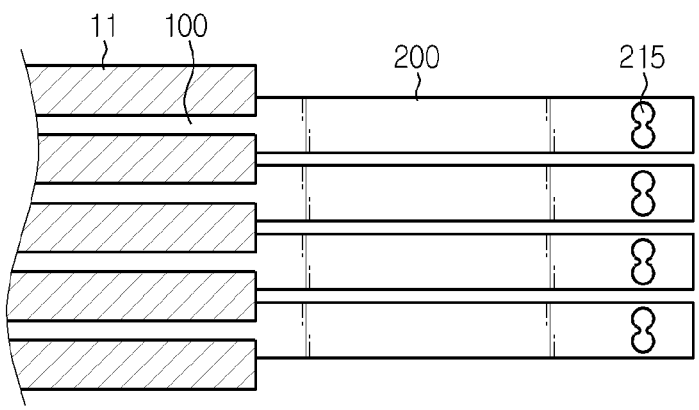
FIG. 6 is a diagram illustrating an FPC connection structure according to a fourth embodiment of the present disclosure.

Next, as shown in FIG. 6, the FPC connection structure 10 according to the fourth embodiment in which the FPC conductor pattern 100 and the FPC terminal 200 are integrally provided is the same as the FPC connection structure 10 according to the third embodiment, but the FPC connection structure 10 according to the fourth embodiment may further include a cutting hole 215 between the substrate terminal unit 21 and portions N to be spot welded.

Figure 7:
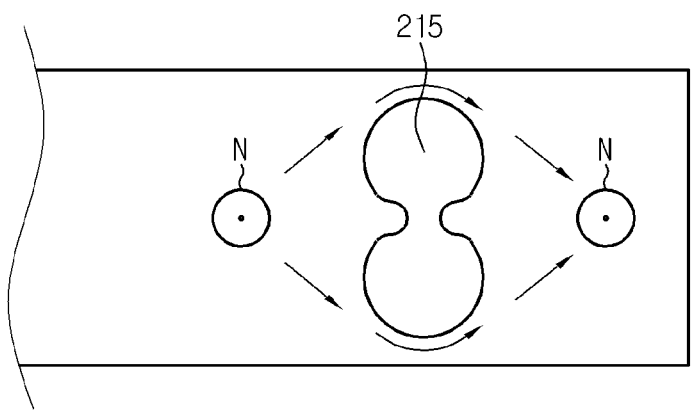
FIG. 7 is a partially enlarged view of FIG. 6.

In the spot resistance welding, the cutting hole 215 may increase the amount of heat generated at welding points by increasing a path (or a welding distance) through which a current flows, as shown in FIG. 7. At this time, the increase in the amount of heat is because a distance between welding points increases, which increases the resistance existing between the welding points.

Therefore, in the FPC connection structure 10 according to the fourth embodiment, the welding strength of the printed circuit board 20 may be further enhanced compared to the above-described embodiments.

According to the FPC connection structure 10 and the FPC connection method using the FPC connection structure 10 according to the present disclosure, the existing FPC may be directly connected to the printed circuit board 20, thereby reducing the cost compared to the existing FPC+connector or wire+connector connection method. In addition, spot resistance welding may be applied, and thus a bonding process management may be easy and a substrate contamination may be reduced compared to the case of soldering.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, in the present specification, although terms indicating directions, such as up, down, left, and right, have been used, it is obvious to those skilled in the art that these terms are merely for convenience of description and may be expressed differently according to the viewing position of an observer or the position of an object.

What is claimed is:

1. A flexible printed circuit (FPC) connection structure connected to a printed circuit board to transmit power or a signal, the FPC connection structure comprising:
   a plurality of strands of FPC conductor patterns coated with an insulating film; and
   a plurality of FPC terminals, each FPC terminal having a first width and extending from an end portion of a corresponding one of the FPC conductor pattern strands, wherein each FPC terminal is a flat plate adapted to enable spot welding on a substrate terminal unit provided on the printed circuit board, wherein each of the FPC terminals comprises a first bonding portion which is in surface contact on the substrate terminal unit and is spot welded to the substrate terminal unit, wherein the first bonding portion has a second width less than the first width.

2. The FPC connection structure of claim 1, wherein each of the FPC terminals further comprises a second bonding portion which is compressed with one end portion of the corresponding FPC conductor pattern strand so as to be connected to the corresponding FPC conductor pattern strand.

3. The FPC connection structure of claim 2, wherein the second bonding portion comprises at least one connection pin in contact with the corresponding FPC conductor pattern strand and vertically passing through the insulation film.

4. The FPC connection structure of claim 3, further comprising a pin cover tightly fitted to an end portion of the at least one connection pin, wherein the pin cover avoids exposure of the end portion to a lower portion of the insulating film.

5. The FPC connection structure of claim 1, further comprising an assembly guide member configured to support the FPC terminals and coupled to the printed circuit board.

6. The FPC connection structure of claim 5, wherein the assembly guide member comprises a terminal fixing portion including slits through which the FPC terminals are configured to pass, and a substrate mounting portion coupled to the printed circuit board by a bolt or a hook.

7. The FPC connection structure of claim 1, wherein the FPC conductor pattern stands and the FPC terminals are integrally formed, and
   wherein each FPC terminal has a width greater than each FPC conductor pattern strand and is not coated with the insulating film.

8. The FPC connection structure of claim 1, wherein each FPC terminal comprises a cutting hole between portions of the FPC terminal to be spot welded to the substrate terminal unit.

9. A flexible printed circuit (FPC) connection method of connecting an FPC to a printed circuit board using an FPC connection structure comprising a plurality of strands of FPC conductor patterns coated with an insulating film and a plurality of flat-plate FPC terminals, each flat-plate FPC terminal having a first width and extending from an end portion of a corresponding one of the FPC conductor pattern strands, wherein each flat-plate FPC terminal is adapted to enable spot welding on a substrate terminal unit provided on the printed circuit board, the method comprising:
   bonding the plurality of flat-plate FPC terminals extending from the end portions of the plurality of FPC conductor pattern strands to the substrate terminal unit of the printed circuit board by applying a spot resistance welding method such that each of the flat-plate FPC terminals comprises a first bonding portion which is in surface contact on the substrate terminal unit and is spot welded to the substrate terminal unit, wherein the first bonding portion has a second width less than the first width.

10. The FPC connection structure of claim 1, wherein the FPC terminals includes nickel (Ni), and the substrate terminal unit includes copper (Cu) plated with gold (Au).

* * * * *